US006834255B2

(12) United States Patent
Abrosimov et al.

(10) Patent No.: US 6,834,255 B2
(45) Date of Patent: Dec. 21, 2004

(54) TIMING CONTROL MEANS FOR AUTOMATIC COMPENSATION OF TIMING UNCERTAINTIES

(75) Inventors: Igor Anatolievich Abrosimov, St.Petersburg (RU); Alexander Roger Deas, Edinburgh (GB)

(73) Assignee: Acuid Corporation (Guernsey) Limited, Guernsey (VG)

( * ) Notice: Subject to any disclaimer, the term of this patent is extended or adjusted under 35 U.S.C. 154(b) by 543 days.

(21) Appl. No.: 09/898,250

(22) Filed: Jul. 3, 2001

(65) Prior Publication Data

US 2001/0056332 A1 Dec. 27, 2001

Related U.S. Application Data

(63) Continuation-in-part of application No. PCT/RU01/00202, filed on May 22, 2001.
(60) Provisional application No. 60/228,115, filed on Aug. 28, 2000.

(30) Foreign Application Priority Data

May 22, 2000 (RU) .............................. PCT/RU00/00188

(51) Int. Cl.[7] .......................................... G06F 101/14
(52) U.S. Cl. ..................... 702/181; 702/125; 702/176; 702/179; 702/89; 326/93
(58) Field of Search ................................ 702/181, 125, 702/176, 179, 85, 89; 327/149, 158, 359, 165; 326/94, 93

(56) References Cited

U.S. PATENT DOCUMENTS

| 4,929,850 | A | 5/1990 | Breuninger ................. 307/272 |
| 5,430,660 | A | 7/1995 | Lueker et al. .............. 364/486 |
| 5,767,715 | A | 6/1998 | Marquis et al. ............ 327/159 |
| 6,002,282 | A | 12/1999 | Alfke ......................... 327/165 |

FOREIGN PATENT DOCUMENTS

| EP | 0967724 A2 | 12/1999 | ............ H03L/7/081 |
| JP | 09-181711 | 7/1997 | ............ H04L/7/033 |

Primary Examiner—John Barlow
Assistant Examiner—Hien Vo
(74) Attorney, Agent, or Firm—Darby & Darby

(57) ABSTRACT

A timing control device and method for minimizing timing uncertainties due to skew and jitter, wherein a device for the compensation of timing errors in multiple channel electronic devices comprises at least one register having a plurality of channels comprising: a clock for providing a clock signal; a reference signal generator for generating reference signals for deskewing the registers. For each register, a corresponding feedback loop is associated for the relative alignment of the register's timing. The feedback loop comprises a device for detecting a deviation from a predetermined level of probability of reading by the register of a desired symbol on a boundary of two reference channel symbols in a sequence, and a set of delay devices which use the detected values of probability to generate a feedback signal.

51 Claims, 10 Drawing Sheets

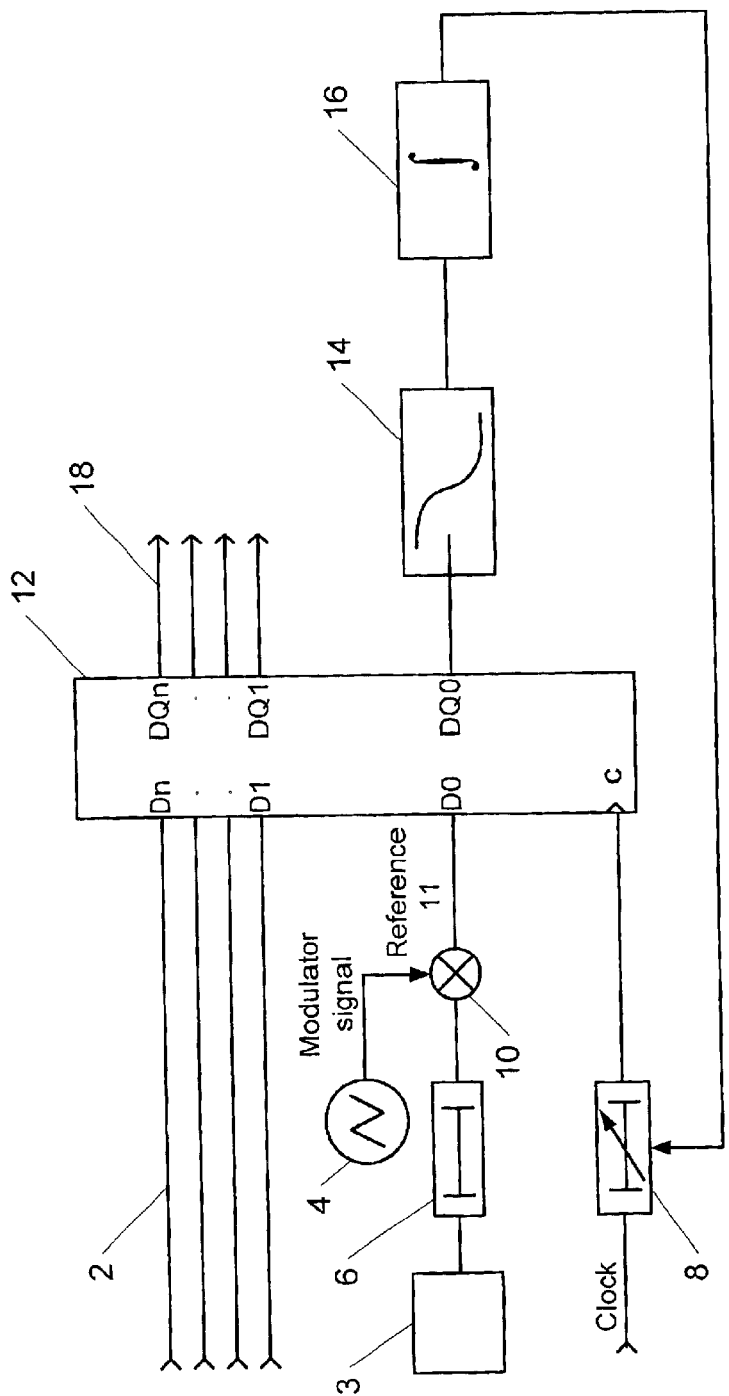
Fig.2a
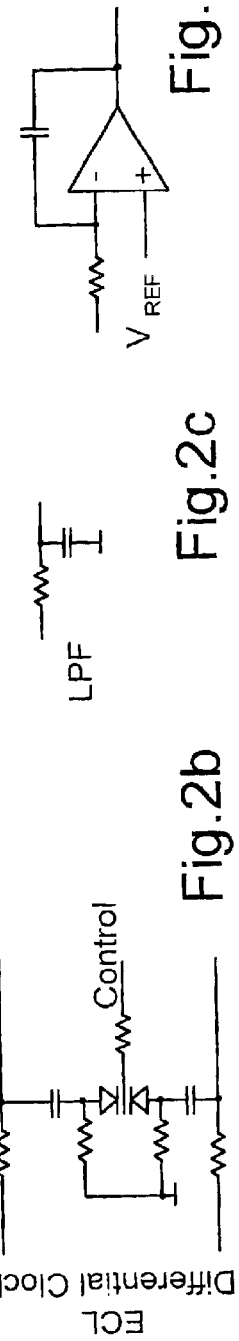
Fig.2b
Fig.2c
Fig.2d

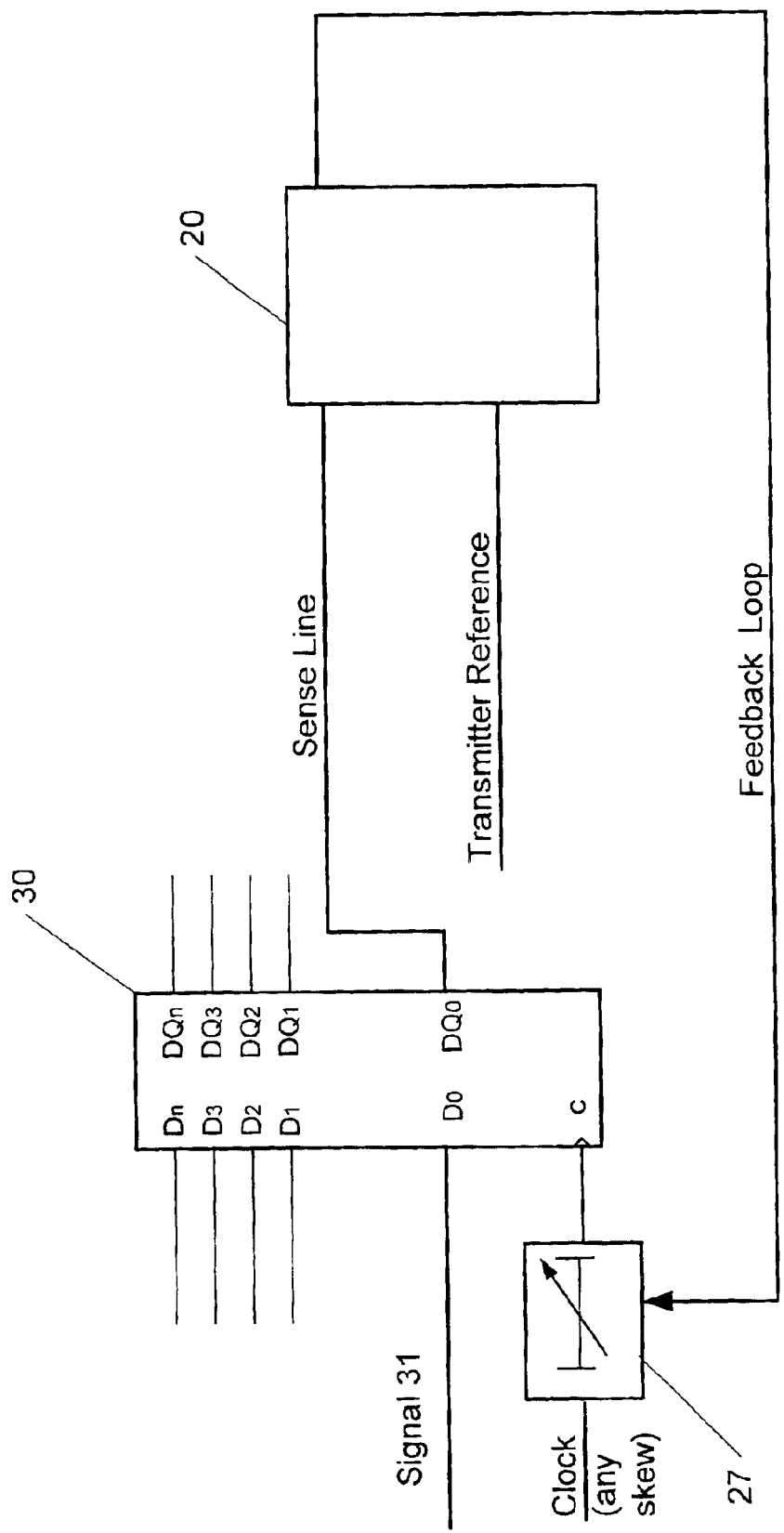

TIMING CONTROL MEANS FOR AUTOMATIC COMPENSATION OF TIMING UNCERTAINTIES

CROSS-REFERENCES TO RELATED APPLICATIONS

This application is a Continuation-in-Part of a PCT application PCT/RU01/00202 filed on 22, May 2001 claiming priorities of PCT/RU00/00188 filed on 22, May 2000 and U.S. Provisional application 60/228,115 filed on 28, Aug. 2000.

STATEMENT REGARDING FEDERALLY SPONSORED RESEARCH OF DEVELOPMENT

Not applicable.

BACKGROUND OF THE INVENTION

1. Field of the Invention

The present invention relates to the reducing of timing uncertainties in high-performance multiple channel devices. More specifically, the present invention relates to a device and method for minimizing timing uncertainties due to asymmetry of rising and falling edges and also duty cycle inaccuracy. The invention can be employed in a digital interface between two items or within a circuit where there is a requirement for tight timing control such as requirement for a low skew between the channels of a register.

The present invention is particularly applicable to digital systems of data transmission, interfaces to memory devices, to test equipment for testing semiconductor devices and to high-speed communications, especially for systems with double data transmission rate (DDR).

2. Description of the Related Art Including Information Disclosed Under 37 CFR 1.97 and 1.98

Transistor linewidths have been reducing according to Moore's Law since around 1971: this involves a doubling of the density of transistors every 18 months. The speed of a transistor, such as a MOSFET, is proportional to the inverse of the square of the channel length, which means that many integrated circuits are now able to operate at speeds above 1 GHz internally. Except for a small number of extremely complicated interfaces, or for serial interfaces, the interface speeds have been a small fraction of the maximum chip operating speed. Another problem has been the width of the interface: the problem of skew between signal lines has hitherto prevented wide interfaces from operating at high frequency, hence creating a fundamental limit to the bandwidth than an interface can carry.

In another example, that of Automatic Test Equipment (ATE), a substantial complexity of deskew circuitry has been required to test high speed devices. Moreover, as soon as the device is under test, the heat generated by the environment of the drivers, the drivers themselves and other factors has caused the skew to alter during the test.

Known is the use of analogue increments to automatically self-calibrate a pulse generator described in U.S. Pat. No. 5,430,660. During the calibration, the output of the oscillator is used to produce output pulses whose edge locations are then adjusted by small digital increments or "slivers" and very small analogue increments or "verniers". The RAM contents are converted to a serial bit stream that controls the coarse pulse width and period as an integral number of top octave periods, or quanta. However, this method of skew control is not automatic and requires an operator to disconnect the generator from the working circuit and connect an output of the generator to a calibration input in order to accomplish the calibration.

It has been a growing tendency in high speed communications, in particular, digital systems of data transmission, to increase data transmission rates and timing accuracy. However, as frequency grows, a problem arises of accurate and reliable reading of previous and subsequent symbols by various devices for receiving and transmitting data.

For digital circuit devices such as flip-flops, latches and other storage circuits, accurate reading of signals is possible only provided strict requirements to set-up and hold times are observed, where "set-up time" is the time before the clock edge during which data are required to be present and stable, and "hold time" is the time after the clock edge during which data are required to be present and stable. These requirements result in that the maximum clock frequency is limited by the sum of hold and set-up times; therefore, it is desirable that set-up and hold time be as short as possible.

Different attempts have been made to improve setup and hold time characteristics, however, a thorough analysis of component elements of setup/hold times is absent in the available art, therefore, it would be helpful to gain a better understanding of phenomena taking place at that.

In FIG. 7a, a block scheme of a real flip-flop is presented, which consists of an ideal flip-flop FF which is noiseless, hysteresis-free and has zero setup and hold times. A real flip-flop additionally comprises delays Td and Tc in data and clock paths, respectively. Also, there is a source N of phase noise in clock path and a source of hysteresis H.

The delays Td and Tc depend on such parameters as temperature, supply voltage, direction of transition (rising or falling edge), frequency of signal and others. The combination of Td and Tc gives a value of setup/hold time which provides stable data transmission. For example, assuming Td varies from 0 to 1 ns, Tc varies from 0 to 1 ns, each independently, it would be impossible to read data earlier than 1 ns after the change occurs, with respect to clock, or less than 1 ns before the change that gives the values of setup time=1 ns, hold time=1 ns. Furthermore, phase noise extends setup and hold times for the value of phase noise.

Flip-flops are often used to synchronize signals operating at different frequencies to a local clock. However, since the signals are asynchronous to the local clock, the setup and hold time specifications associated with the flip-flop are sure to be violated. When the setup and hold time is violated, the output response of the flip-flop is uncertain. The output may assume a "metastable" state, defined as the time period during which the output of a digital logic device is not at logic level 1 or logic level 0, but instead resides at an output level between logic level 0 and logic level 1. The voltage ranges corresponding to different logic levels are specified by the manufacturer of the device. For bipolar TTL technology, for example, the metastable region might lie between 0.8 volts and 2.0 volts.

The metastable problem occurs when the signal being input to the flip-flop is undergoing a transition from one logic level to the other simultaneously with the active edge of the local clock pulse, causing the latch section of the flip-flop to latch at the intermediate voltage level. Since the input data is changing while it is being clocked, the system designer does not care if the flip-flop goes to either a high or low logic level in this instance, just so long as the output does not "hang-up" in the metastable region. Eventually, the output of the flip-flop will stabilize at a valid logic level;

however, logic circuitry following the flip-flop depends upon the delay specification (stated time period from the clock pulse to a valid output) being met. A metastable output may cause this logic circuitry to fail. Thus, the metastable characteristics of the flip-flop used to synchronize an asynchronous data stream can influence overall system reliability.

One approach to mitigate the problem of metastable outputs is to provide a second flip-flop in series with the first flip-flop, or more flip-flops cascaded as proposed in U.S. Pat. No. 4,929,850. The clock to the second flip-flop is delayed relative to clock to the first flip-flop, thus allowing time for the output signal of the first flip-flop to stabilize at a valid logic level before clocking the data into the second flip-flop. In many applications, this delay is excessive. Furthermore, the logic may still fail if the output of the first flip-flop remains in the metastable region for a period greater than the delay between the clocks.

Thus, the traditional solution of employing two serially connected flip flops is not desirable in applications where an output is needed rapidly. The use of the second flip flop delays the resulting output by an entire clock period. In order to rapidly provide this output, it has also been proposed to rapidly resolve internal logic signals through the use of the deselect synchronizer, instead of two flip flops.

Another approach is described in U.S. Pat. No. 6,002,282 according to which a closed-loop clock delay adjustment system compensates the difference between the delay introduced by on-chip clock buffers and delays inserted at the device data input pins. By measuring the actual real time drift, the clock buffer delay is adjusted to minimise the input set-up time without additional requirements to hold time. The value of Tc is adjusted at a rising edge with the same value of Td that provides a significant reduction in setup/hold time.

However, even after the adjustment is made, there are still phase noise and asymmetry of the rising and falling edges that influence the setup/hold time.

Moreover, the moment of reading data depends also on frequency because the system described in U.S. Pat. No. 6,002,282 uses as a reference an internal clock of high frequency which is inaccurate to the extent it is frequency dependent, because a high frequency clock has additional frequency-dependent phase errors due to system parasitics.

One more source of errors is the hysteresis at the receiver which increases setup/hold time for the value of hysteresis. However, still the most important phenomena that has not been taken into consideration until now, but yet influencing the accuracy of operation of a digital device is that each flip-flop, latch and similar device can be defined by its inherent probability function of transition from "0" to "1" depending on set-up and hold times.

In FIG. 10a is shown a sequence of symbols S1–Sn transmitted through a channel, where the former symbol S1 changes to the next symbol S2 at a moment "O".

Let us consider in more detail the moment of transition from signal S1 to signal S2 with reference to FIG. 7c.

The probability of reading symbol S2 when the time is much less than "0" is equal to 0%, the same as the probability of reading symbol S2 at times much more than "0" is equal to 100%, while in time interval near 0, the probability changes smoothly from 0% to 100%, with value of 50% at time 0. This phenomenon is caused by system noise and other static errors and because of this, has a probabilistic nature.

It can be approximated by the following function:

$$P(t) = \frac{1 + \text{Erf}(t/\sigma)}{2}$$

where t—is the moment of reading data;
P—is the probability function;
σ—is rms (root-mean-square) value of phase noise.

An example probability function for a typical flip-flop is shown in FIG. 7b, where P is the probability, and t is the time difference between the actual moment when the data is read and the moment when the data crosses a threshold of the flip-flop. It is possible to measure this probability function experimentally, e.g. using procedure described in details in WO 00/00837, published on Jun. 1, 2000, the description of which is incorporated herein by reference.

For different moments of reading data, the probability of reading either new or previous data changes gradually from 0 to 100% of the time defined by the value of phase noise of the system in whole, so that a selected range of ΔP would correspond to a predetermined level of timing uncertainty. It shall be mentioned that the term "timing uncertainty" relates to uncertainty of the moment of reading data caused by different reasons including phase noise, static input offset and others and reflects the total effect caused by a sum of these factors.

Thus, another term of high importance which is used within the context of the present invention and closely related to the uncertainty in reading data is "a probability of reading a desired symbol on a boundary of two symbols in a sequence of symbols transmitted through a channel". It is obvious from the figure, that if the placement of the moment when the data is read on the probability function of transition from "0" to "1" is not controlled, no reliable data is obtained.

The above-described problems are exacerbated as timing tolerances become more severe with higher data transfer rates. For example, if the data clock does not latch the data applied at the proper time, data errors may result. Similar problems exist in many memory devices, such as synchronous DRAMs, and contemporary microprocessors which must process control and other signals at a high rate of speed.

Unfortunately, there has heretofore been no suitable means for ensuring that digital signals are latched in high speed digital interfaces in proper time at very high data transfer rates.

In PCT/RU00/00188 filed in the name of the applicant of the present invention, a timing control means is described for the compensation of timing errors in multiple channel devices wherein for each register a corresponding feedback loop is associated for the relative alignment of register's channels timing in relation to the reference signal, said feedback loop comprising a means for detecting a deviation from a predetermined level of probability of reading by the register a desired symbol on a boundary of two reference channel symbols in a sequence to generate a feedback signal to compensate timing errors in said register.

By measuring real values of the probability function of transition from "0" to "1", according to PCT/RU00/00188, the actual moment of reading data may be determined with the accuracy equal to a very small fraction of the value of the phase noise causing this uncertainty that makes possible highly accurate (up to subpicoseconds) placement of the average position of the moment of reading data.

However, the obtained accuracy is often insufficient when waveforms are asymmetrical with respect to the rising and falling edges. Another common problem for high speed data transmission is the inequity of duty cycles that is especially sensible in DDR systems.

BRIEF SUMMARY OF THE INVENTION

The object of the invention is the provision of a high speed digital interface having multiple channels, in which digital signals are latched at the proper time at very high data transfer rates and that would be insensible to the asymmetry of waveforms and inequity of duty cycles and other signal errors, as well as a system phase noise.

Thereby, an interface is provided involving drivers and receivers to have the minimum or predefined skew, regardless of whether that interface is within the same chip, within the same circuit board, or in different locations in the globe.

The advantages of the present invention is a great reduction in the cost and complexity of high speed interfaces, combined with an increase in the potential bandwidth. For example, the RAMBUS interface is essentially a serial interface straining the technology available to provide 9 to 18 bits of high speed parallel transfer. The present invention would involve no strain of technology, and give a bandwidth which could be one or two orders of magnitude higher than the fastest RAMBUS components available today. At another level, an ATE system could reduce by an order of magnitude the cost of the skew control circuitry, which forms a very large part of the cost of a test head.

The invention concerns the control of timing within a register. The register may have any number of outputs. For example, the invention enables any number of registers to have the same skew, which can even be controlled to be zero at all times during its operation.

In one aspect, the invention is a timing control means for the compensation of timing errors in multiple channel devices comprising at least one register, the means comprising a clock for providing a clock signal; a reference signal generator for providing a reference signal applicable through a reference channel to the register for deskewing the register's channels; wherein for each said register a corresponding feedback loop is associated for the relative alignment of register's channels timing in relation to the reference signal, said feedback loop comprising a means for detecting a deviation from a predetermined level of probability of reading by the register a desired symbol on a boundary of two reference channel symbols in a sequence and a set of delay means which uses the determined information on deviation from the fixed level of this probability to generate a feedback signal to compensate timing errors in said register.

The invention uses a channel of the register to take a reference signal which is offset in phase from the register's clock. For example it can be the clock signal delayed by a stable structure such as a pcb track. The output of the register taking this reference channel is applied to an integrator which implements the detecting means to create a negative feedback signal which is applied to a delay circuit with a monotonic transfer function on the clock input to the register.

In the diagram of FIG. 10c, which is called an eye diagram, an interval of timing uncertainty is shown with respect to the probability function of FIG. 7b. Increases in phase offset between the sampling point and the transition of the reference signal will create a pulse stream and the system will adapt to operate on a predetermined level of probability, which may be chosen as, e.g. the point where there is the maximum uncertainty, which means that 50% of the values are 0 and 50% are 1 in a binary digital system. This point is close to or the same as the point where metastability occurs and may include metastable phenomena in susceptible registers. For a description of metastability, refer to "Metastability and the ECLinPS™ Family" by Rennie Wm. Dover and Todd Pearson, AN1504, Motorola Inc., 1996; and also "High-Speed Digital Design: A Handbook of Black Magic" by Howard W. Johnson and Martin Graham, Prentice Hall PTR, 1993, Englewood Cliffs, N.J. 17632.

In another aspect of the invention, a self calibrating receiver comprises a register having a plurality of channels having inputs and outputs; a clock for providing a clock signal to the register; a reference signal generator connectable to the input of at least one said channel of said register for supplying reference signals for deskewing the register; a detecting means connectable to the output of at least one said channel of said register for detecting a deviation from a predetermined level of probability of reading by said register a desired symbol on a boundary of two reference channel symbols in a sequence; wherein the output of the detecting means is connectable to a set of delay means which uses the information received by said detecting means to generate a feedback signal to compensate timing errors in said register.

Where the register has a degree of hysteresis, this would produce a hunting effect whereby the skew varies around a mean. This hunting is typically +/−45 ps for registers using ALVCH technology—it appears to be a result of the use of a non-differential external clock which is passed through an inverter internally to the register, as well as other factors. To remove this skew variation, the reference signal can be modulated in phase to produce a feedback signal which extends in time to be wider than the width of the hysteresis. The integrator will then have the effect within the feedback system of adjusting the clock phase to contain an equal number of 0s and 1s in a binary system, removing all hunting, without any detriment to the deskew accuracy.

In still another aspect of the invention, a self calibrating transmitter with expandable data width comprises at least one register having at least one channel having an input and output; a clock means for providing a clock signal to said register; a reference signal for supplying reference signals for deskewing said register's channel output in relation to the reference signal; a phase comparator, one input of which is connected to the reference signal and another input is connected to a sense signal at the register's output; and at least one feedback loop associated with the output of said phase comparator, the feedback loop comprising a set of delay means to compensate the timing errors in transmitter channels, wherein the reference signal is connectable to the input of the phase comparator; and an input of at least one said channel of said register is connectable to another signal for providing the sense signal to the phase comparator for deskewing the register.

It shall be mentioned that in this embodiment, the phase comparator serves as the detecting means for detecting a deviation from a predetermined level of probability of reading by said register a desired symbol on a boundary of two reference channel symbols in a sequence; wherein the information received by said phase comparator is used to generate a feedback signal to compensate timing errors in said register.

Furthermore, the present invention provides also the means for enhancing the timing accuracy for high speed digital data transmission systems experiencing asymmetry of rising and falling edges as illustrated in FIG. 8a, and/or inequity of duty cycles as shown in FIG. 8b. It shall be noted that rising edge in even data transmission slots and odd data transmission slots will be called even and odd rising edges, respectively, for the convenience of further explanation.

According to this aspect of the invention, the self-calibrating transmitter comprises the features as stated for the third embodiment, wherein said phase comparator comprises at least one channel for providing rising edge sense signal and at least one channel for providing falling edge sense signal for deskewing the register, while the calibration is effected for even rising, even falling and odd rising edges.

Thus, a system using the present invention will have a skew not more than the intra-register skew, which is caused for example by the parasitics of the device package and can be eliminated such as by compensatory track lengths in the printed circuit board (pcb) or by delays or verniers on each line or channel.

The above disclosed technique can be effectively applied for improving transmission parameters of high speed transmission systems including DDR systems, such as Rambus, or other systems in which the data rate is multiple of a main clock frequency.

BRIEF DESCRIPTION OF THE SEVERAL VIEWS OF THE DRAWINGS

For a better understanding of the present invention and the advantages thereof and to show how the same may be carried into effect, reference will now be made, by way of example, without loss of generality, to the following description now taken in conjunction with the accompanying drawings in which:

FIG. 1b shows wave forms for a Clock, Reference and Sample Enable signals generated in the system of FIG. 1a.

FIG. 2a is a block diagram of a self calibrated receiver with a means for obviating the internal register's hysteresis using a modulator signal according to a second example embodiment of the present invention.

FIG. 2b shows an example of an analog monotonic delay vernier which may be used as a variable delay 8 in FIGS. 1a and 2a.

FIG. 2c is an example of a low pass filter 14 in FIG. 2a.

FIG. 2d is an example of an integrator 16 in FIG. 2a.

FIG. 5 is a block diagram of a self calibrated transmitter in accordance with a third example embodiment of the present invention.

FIG. 10b shows wave forms for a clock and reference signals provided in the system of FIG. 10a.

DETAILED DESCRIPTION OF THE INVENTION

Figure 1A:
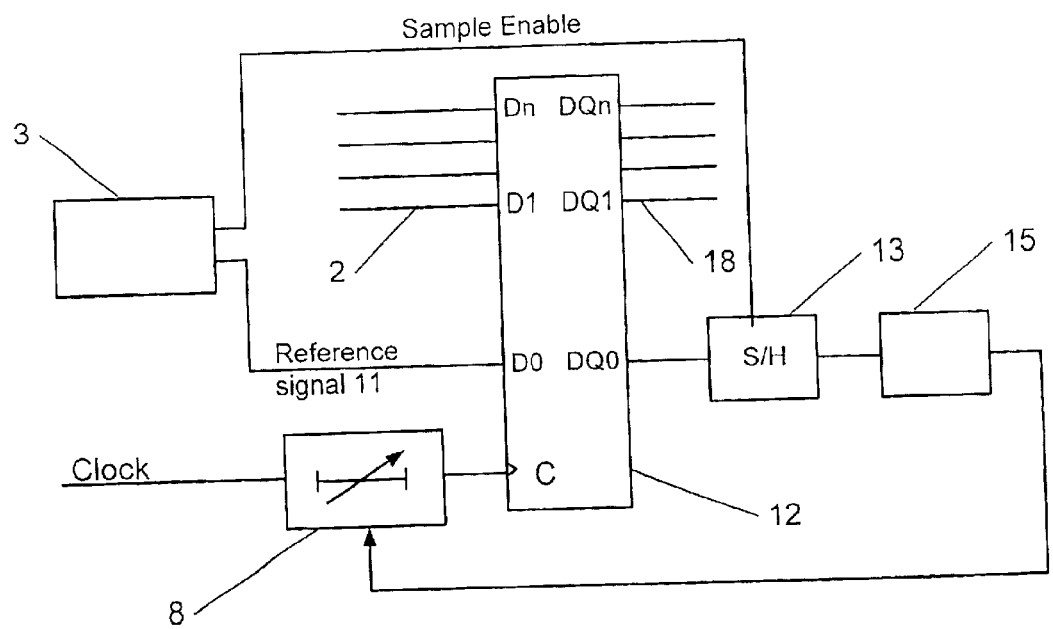
FIG. 1a shows a general block diagram of a timing control means according to the present invention.

In FIG. 1a, an example embodiment of the present invention in its most general way is illustrated. As shown in the figure, register 12 has a plurality of channels having inputs 2 and outputs 18, wherein one of the channels, D0-DQ0, is used to deskew the register using a reference signal 11. Reference signal 11 in this example embodiment is preferably supplied by the reference generator 3 that generates the signals having wave forms shown in FIG. 1b.

Typically, any media including transmission lines, clock networks, etc is frequency dependent. Different factors, such as RC networks, dielectric coefficient, reflections and standing waves, contribute to this dependence so that in the absence of special measures directed on elimination of these factors, they will inevitably increase the setup/hold time. Therefore, in the present invention, a reference signal is provided, as described above, which seldom changes thereby allowing complete settlement, so that its history pattern would not affect the moment of reading data.

Figure 1B:
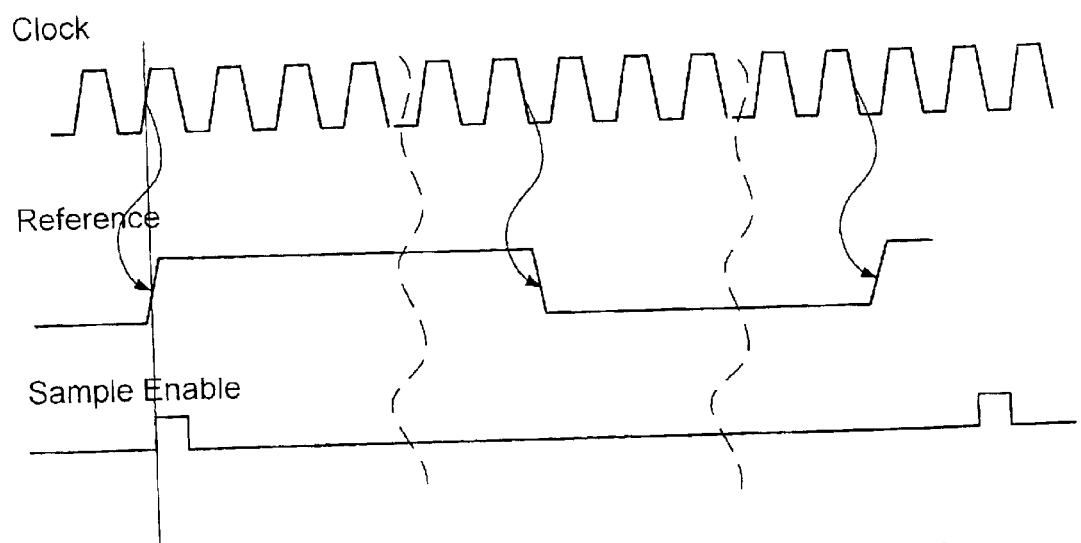

To achieve this, before the reference signal changes state, its value is maintained at the same logic value for a certain number of clock periods to allow all reflections to dissipate so that to obtain a reference signal which is free of changes caused by previous transition as illustrated in FIG. 1b.

The reference signal generator 3 provides also a Sample Enable signal which shall be active for not more than one period of clock signal during the cycle following the referenced edge as shown in FIG. 1b. In case of analogue feedback circuitry, the obtained Sample Enable signal is supplied to a Sample Hold device 13. In case of digital feedback circuitry, the obtained Sample Enable signal may be simply connected to Clock Enable input of the flip-flop connected to the output of register 12. In this case, the flip-flop would provide the function of the Sample Hold Device 13 shown in FIG. 1a.

Further, the system comprises a variable delay 8 which may be implemented as described in detail below. The output of the register is connected to detecting means 15 for determining a deviation from some predetermined level of probability of reading a desired symbol by said register. The detecting means may be implemented in an integrator shown in FIG. 2d and a low pass filter shown in FIG. 2c, or as a phase comparator as shown in the embodiment of FIG. 5. Other suitable means may be selected by a specialist in the art. The output of the detecting means 15 is fed to the delay 8, for example such as shown in FIG. 2b, which uses the determined information on deviation from the predetermined level of probability to generate a feedback signal to compensate timing errors in said register.

Figure 7A:
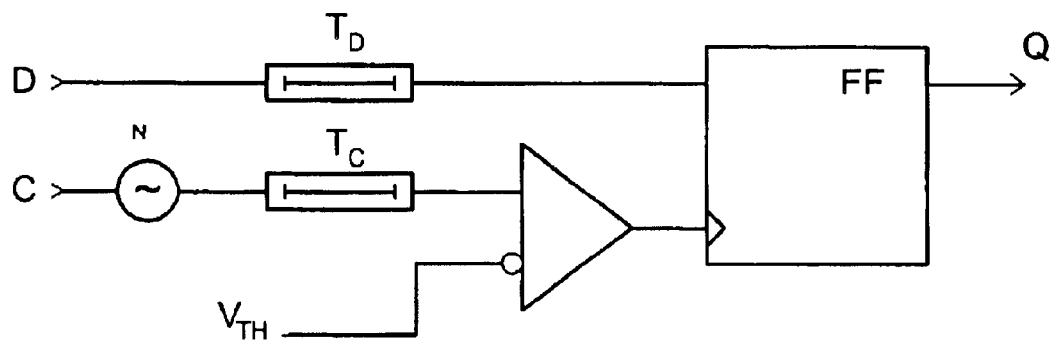
FIG. 7a is a schematic representation of a non-ideal flip-flop.
Figure 7B:
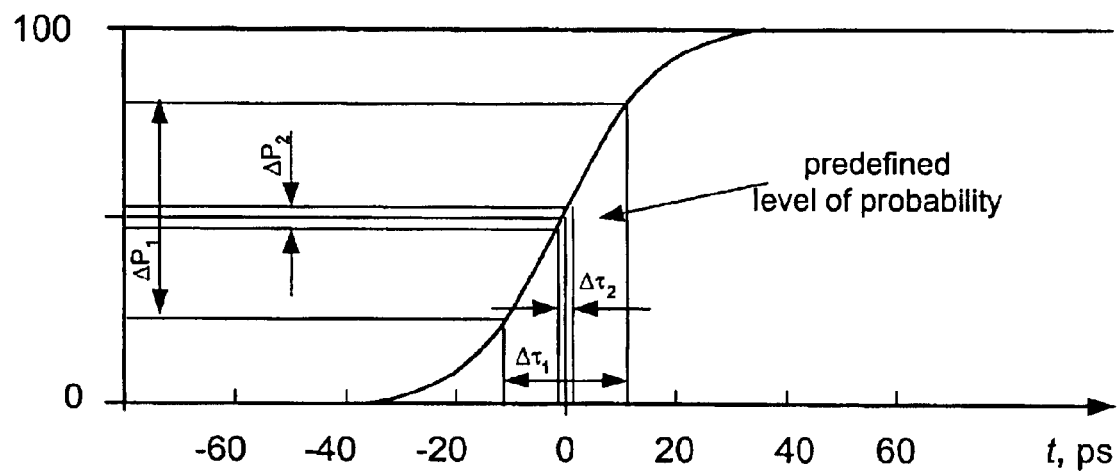
FIG. 7b shows an example probability function for a non-ideal flip-flop.
Figure 7C:
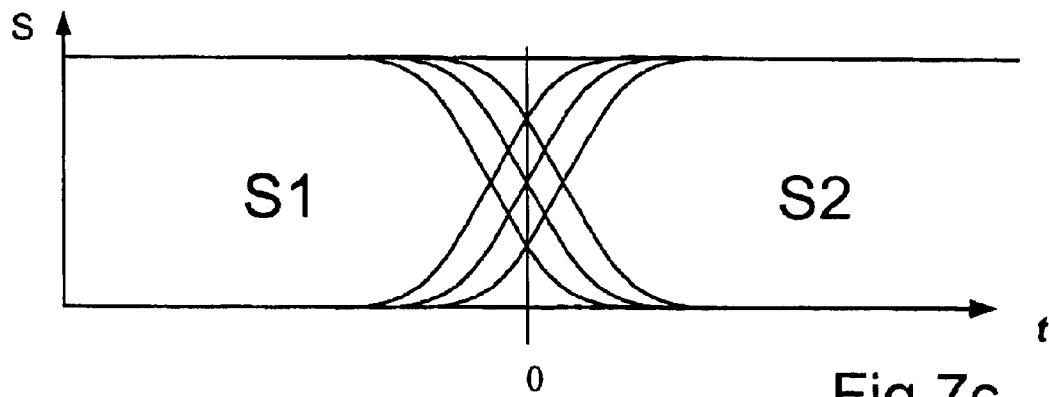
FIG. 7c shows partially an "eye diagram" for a typical flip-flop.

It may be explained in more detail with reference to FIG. 7b, that the selection of a range of probability (shown as ΔP) shall be considered as an important feature of the invention as it defines the accuracy of placement of the moment of reading data with respect to a reference (shown as Δt) and thus, the performance of the system in whole. In comparison, according to U.S. Pat. No. 6,002,282, an integrator in FIG. 4, obviously, can provide some reference that is defined by a threshold of element 216, however, this threshold itself depends on temperature and supply voltage and therefore, would have an indefinite position on the curve of FIG. 7b, e.g. within an interval $\Delta P_1$ of probability giving the wide interval $\Delta T_1$ for a moment of reading data in respect to the reference, while the narrow predetermined level of probability shown by $\Delta P_2$ would result in accurate placing of the moment of reading data within the range $\Delta T_2$ and thus, in accurate reading of data.

A second example embodiment of the present invention is shown in FIG. 2a. A self calibrating system according to this embodiment comprises a receiver implemented in register 12 which in this case has a degree of hysteresis, a low pass filter 14, integrator 16, a fixed delay 6, a variable delay 8 and additionally a source 4 of modulator signal. Reference signal 11 generated by a reference signal generator 3 in this example embodiment is delayed by a fixed delay 6, preferably to centre the reference transition in the middle of the programmable range of the variable delay 8 on the clock path.

The output DQ0 of the reference channel D0-DQ0 from the register is passed into a low pass filter 14, such as detailed in FIG. 2c, then to an integrator 16 (a suitable integrator may be such as presented in FIG. 2d, or some other integrator may be selected by a specialist in the art). The output of the integrator 16 is used to control an analog delay 8 with a monotonic transfer function such as detailed in FIG. 2b, or a digital delay, such as MC 100E195 manufactured by Motorola Inc. Let us assume that register 12 has a hysteresis, for example, due to input voltage hysteresis, bushold function or, timing hysteresis caused by setup time dependence on the register's output state.

Figure 4A:
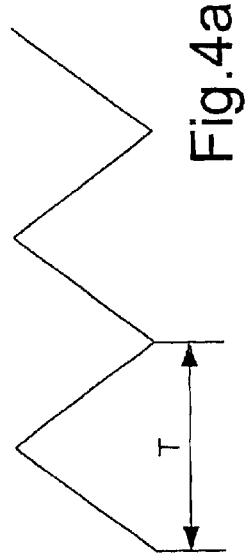
FIGS. 4a–4c illustrate wave forms for a modulator signal (FIG. 4a) which is in this case an output signal from integrator 26 and clock signal (FIG. 4b) applicable to the system shown in FIG. 3 according to the present invention and a resulting reference signal which is a superposition thereof (FIG. 4c).
Figure 4B:
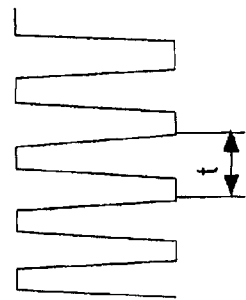
Figure 4D:
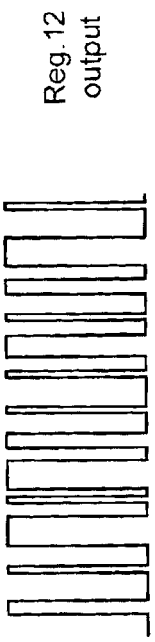
FIGS. 4d–4e show a DQ1 output signal from register 12 shown in FIG. 3 in the absence of modulator signal (FIG. 4d) and in the presence of modulator signal (FIG. 4e).
Figure 4E:
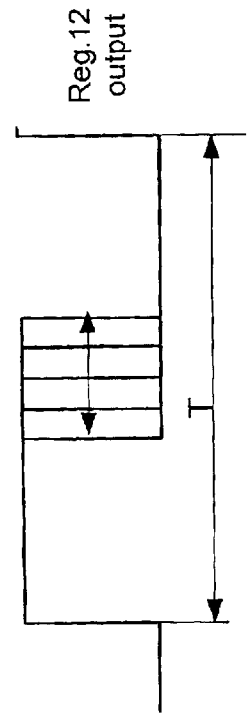

In this case we can phase modulate the clock signal shown in FIG. 4b by another signal, called modulator signal, which signal does not change the mean value of the register 12 output, from the source 4 in mixer 10. In most cases this signal can be a saw tooth, a triangular wave, such as, for example, shown in FIG. 4a, or even white noise to maintain the accuracy of the reference signal. The modulator signal imposes a phase, or other manipulation with a phase component of the clock signal, such as adding periodic signal on the clock signal. For the clock and modulator signal shown in FIGS. 4b and 4a, respectively, the resulting reference signal 11 will be as shown in FIG. 4c.

It is appreciated that in the absence of the signal hysteresis, the circuitry as described in FIG. 2a may be simplified by omitting the above described means for generating the modulator signal.

The means for generating a modulator signal according to the second example embodiment of the present invention may be implemented as described in detail with reference to FIG. 3.

Figure 3:
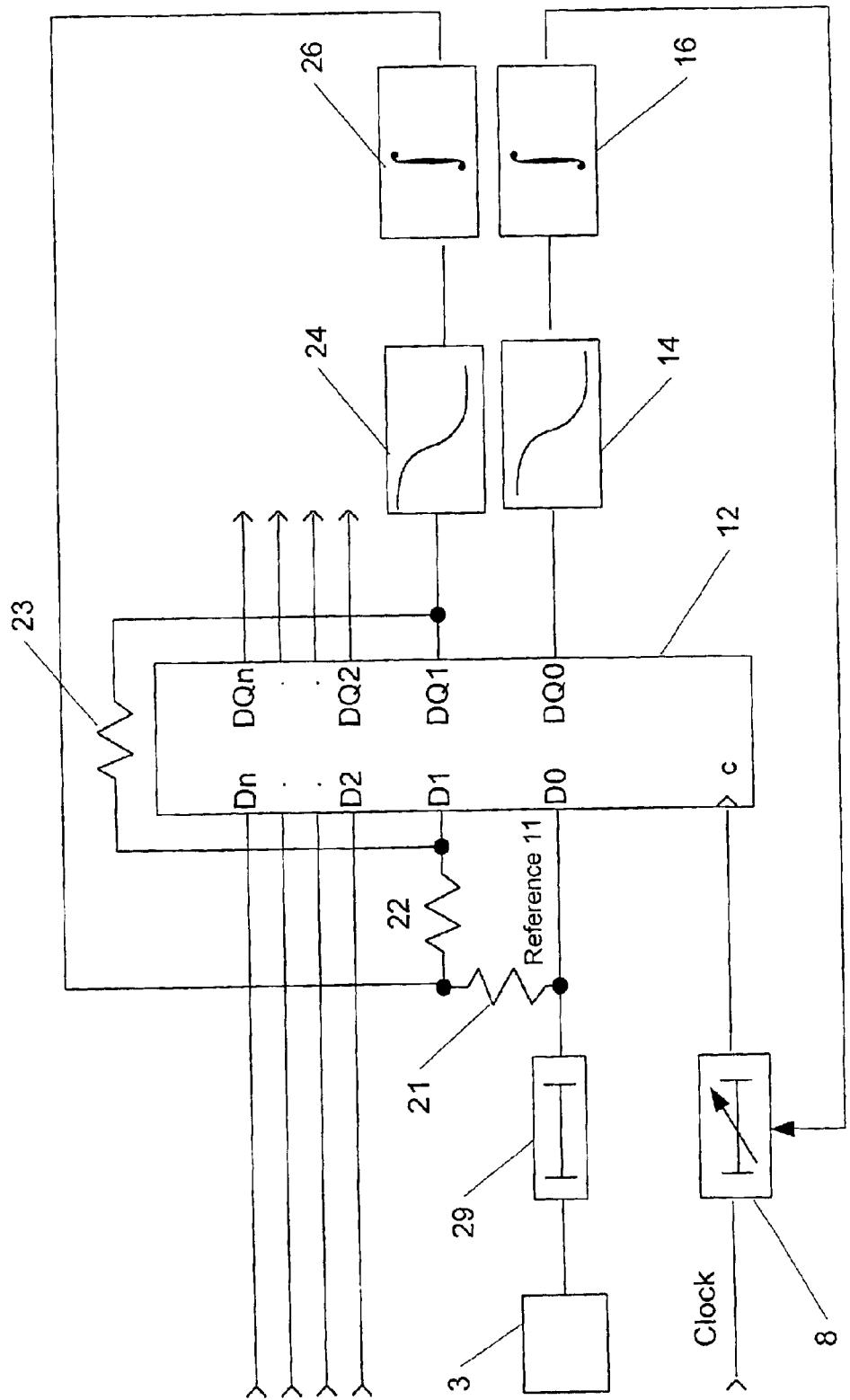
FIG. 3 is a detailed circuit diagram showing an example implementation of a source of modulator signal for obviating the internal register's hysteresis using the modulator signal generated from the same register.

As shown in FIG. 3, an advantageous method of generating and applying the modulator signal is to use another channel of the same register to produce a triangle signal formed by low pass filter 24, inverting integrator 26 and resistors 22 and 23, where feedback from a low pass filter or integrator connected to the output of that channel back to the input causes a triangular wave to be generated.

Figure 4F:
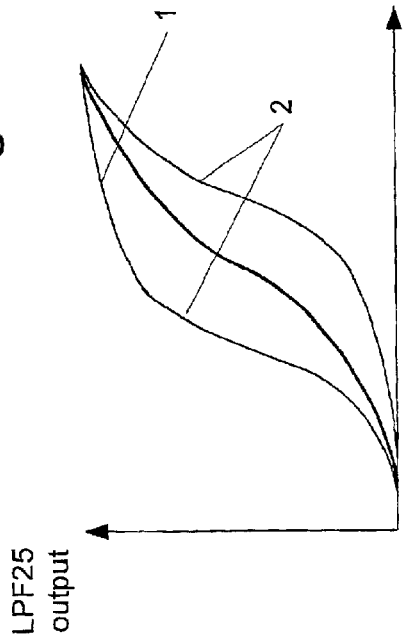
FIG. 4f shows a transfer function graph for monotonic delay vernier 28 and low pass filter 25 for a feedback loop shown in FIG. 3.
Figure 4C:
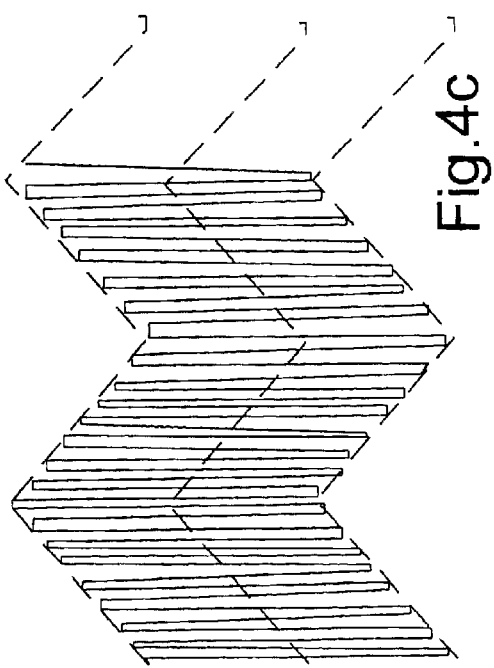

For a system as shown in FIG. 3, the transfer function corresponding to the case when the feedback loop is opened, is presented in graph 2 of FIG. 4f, which illustrates effect of hysteresis in register 12. While in the case of absence of hysteresis, the transfer function will be as shown in graph 1 of FIG. 4f (in some cases the transfer function may be linear, in some cases not linear).

Thus, an additional objects of the present invention according to this embodiment is converting the system having a hysteresis into a hysteresis-free system.

This is required to obtain a stable behaviour of the above system and thus, to reduce the skew by a half width of the hysteresis loop. In this case, the signal at the output of the register 12 will have a randomly modulated pulse width as shown in FIG. 4e, instead of random values of this output, as shown in FIG. 4d. In both cases, when the system reaches the stable state, the mean value of the signal at the output of the filter 14 is equal to the half amplitude of the signal at the output of the register 12 that corresponds to the maximum level of phase noise where the probability to capture "1" and "0" is equal to each other, i.e. 50/50.

The ratio between resistors 22 and 23 determines the amplitude of the triangle modulating signal imposed on the reference being divided by the ratio between terminating resistor 21 and reference source impedance. Preferably, the depth of modulation of the reference signal shall slightly exceed the hysteresis loop width that allows to calculate the optimal ratio for resistors 22, 23. A third example embodiment of the present invention illustrates how the problem of eliminating output channel skew may be solved with respect to a transmitter by using the self calibration according to the present invention.

FIG. 5 is a block diagram of a transmitter with expandable data width (i.e. with a great number of channels) which can be much higher than provided by a single register, in accordance with the third embodiment of the present invention wherein a phase comparator is used to maintain output zero skew between multiple driving registers.

Different types of phase comparators may be used for deskewing the transmitter, for example, a flip-flop may be exploited. In this case, to one input of this flip-flop, which may be either a clock input, or data input, the reference signal is connected, while to the other input a sense signal is connected. Alternatively, the phase comparator 20 can be made as a circuitry shown in FIG. 1a, with the addition of integrator shown in FIG. 2d.

It shall be evident for a specialist in the art that data transmitting lines of the register may be used as sense signals for the phase comparator, however, in this case, the comparator shall ignore cycles which do not have any transitions that may be implemented by using signals on inputs of the register on a previous cycle.

It shall be noted that the important advantage of the proposed invention is that it allows to compensate and eliminate the skew "on the fly" during the operation.

Figure 6:
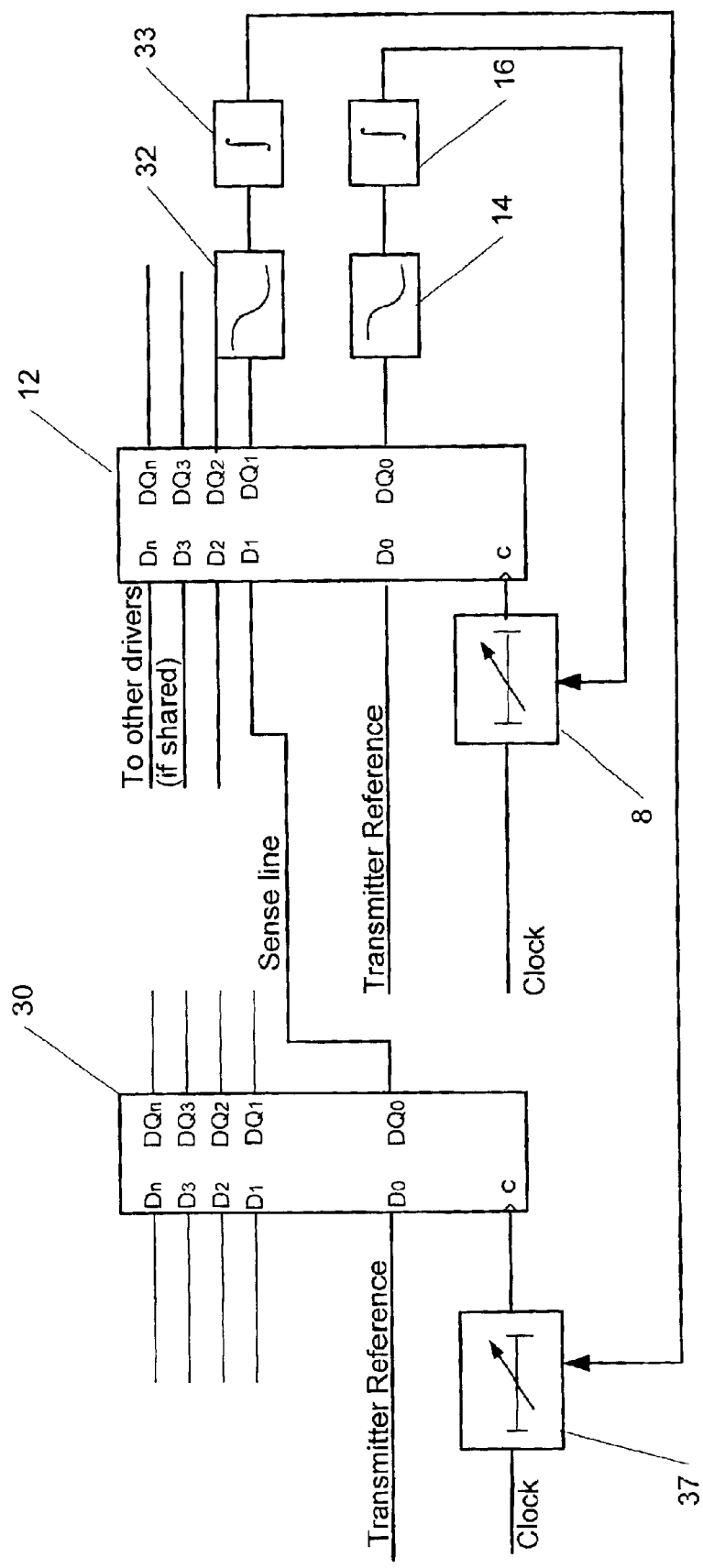
FIG. 6 is a block diagram of a self calibrated transmitter wherein an auxiliary self calibrated register is used to maintain output zero skew between multiple driving registers.

A detailed example embodiment of the self calibrated transmitter is illustrated in FIG. 6. In this embodiment the phase comparator is implemented in a receiver shown in FIG. 2a. It is also appreciated that circuitry elements in this figure designated by the same position numbers as in FIGS. 2a and 3 are the same as already described, or equivalents thereof.

In FIG. 6, register 12 is an auxiliary register which serves to deskew transmitting register 30; both registers being connected in series, with the feedback circuit comprising low pass filters 32 and 14 feeding integrators 33 and 16, to generate feedback signals to deskew the outputs of register 30 and inputs of register 12 to transmitter reference signal using verniers or analogue delay elements 8 and 37. The total skew in this situation amounts to a sum of intra-channel input skew of the auxiliary register 12 and intra-channel output skew of register 30. By the means described herein the overall timing inaccuracy of an entire system can be reduced to less than 10 ps after compensation for the differential track lengths between channels due to packaging.

Figure 8A:
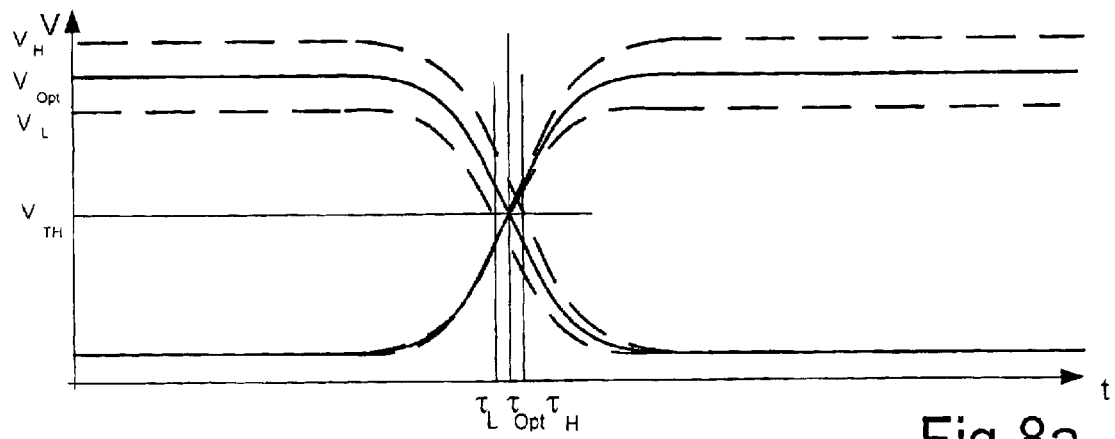
FIG. 8a illustrates how the differences in wave forms for high and low voltage data cause timing inaccuracies.

Still another example embodiment of the self calibrated transmitter is illustrated in FIG. 8. In this embodiment the phase comparators are also implemented in receivers shown in FIG. 2a. It is also appreciated that circuitry elements in this figure designated by the same position numbers as in FIGS. 2a, 3 and 6 are the same as already described, or equivalents thereof.

Figure 9:
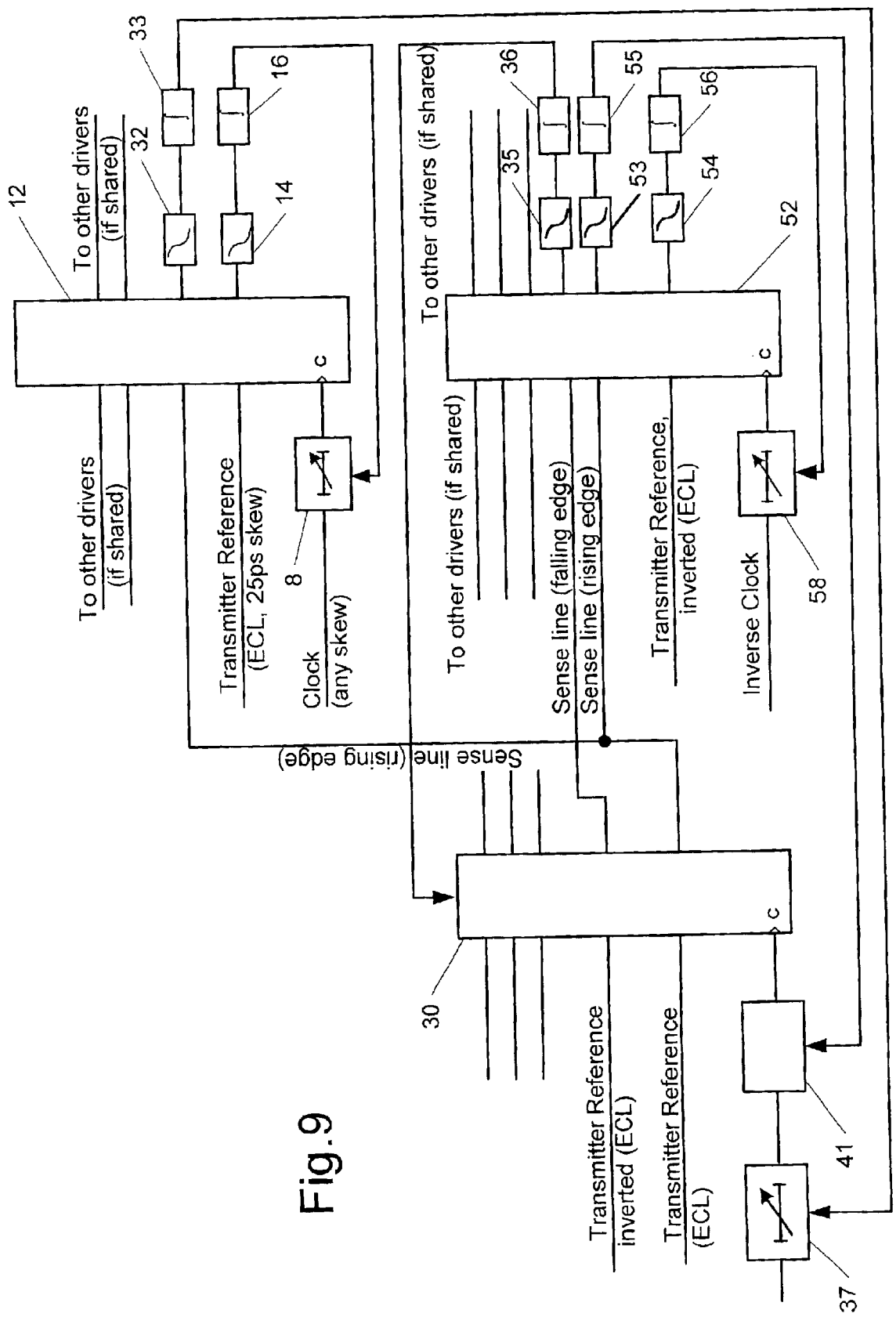
FIG. 9 is a block diagram of a self calibrated transmitter wherein one auxiliary self calibrated register is used for rising edge calibration on even cycles and another self calibrated register is used for falling edge calibration with respect to reference and rising edge calibration on odd cycles.

In FIG. 9, registers 12, 52 are auxiliary registers for deskewing transmitting register 30. Register 52 is connected to the falling edge sense line of transmitter 30 to control the falling edge of the transmitter's output with respect to the reference clock and register 12 is connected to the rising edge sense line of the transmitter to control the rising edge respectively.

The auxiliary self-calibrated receiver 52 serves for controlling falling edge and odd rising edge timings and comprises three feedback circuits.

The first feedback circuit serves for self-calibration of register 52 and includes a low pass filter 54 feeding integrator 56 for generating a feedback signal using analogue delay element 37 similarly to as has been already described with reference to FIG. 6.

The second feedback circuit serves for deskewing the odd rising edge of register 30 and includes low pass filter 53 feeding integrator 55 and duty cycle correction stage and frequency doubler 41.

Figure 8B:
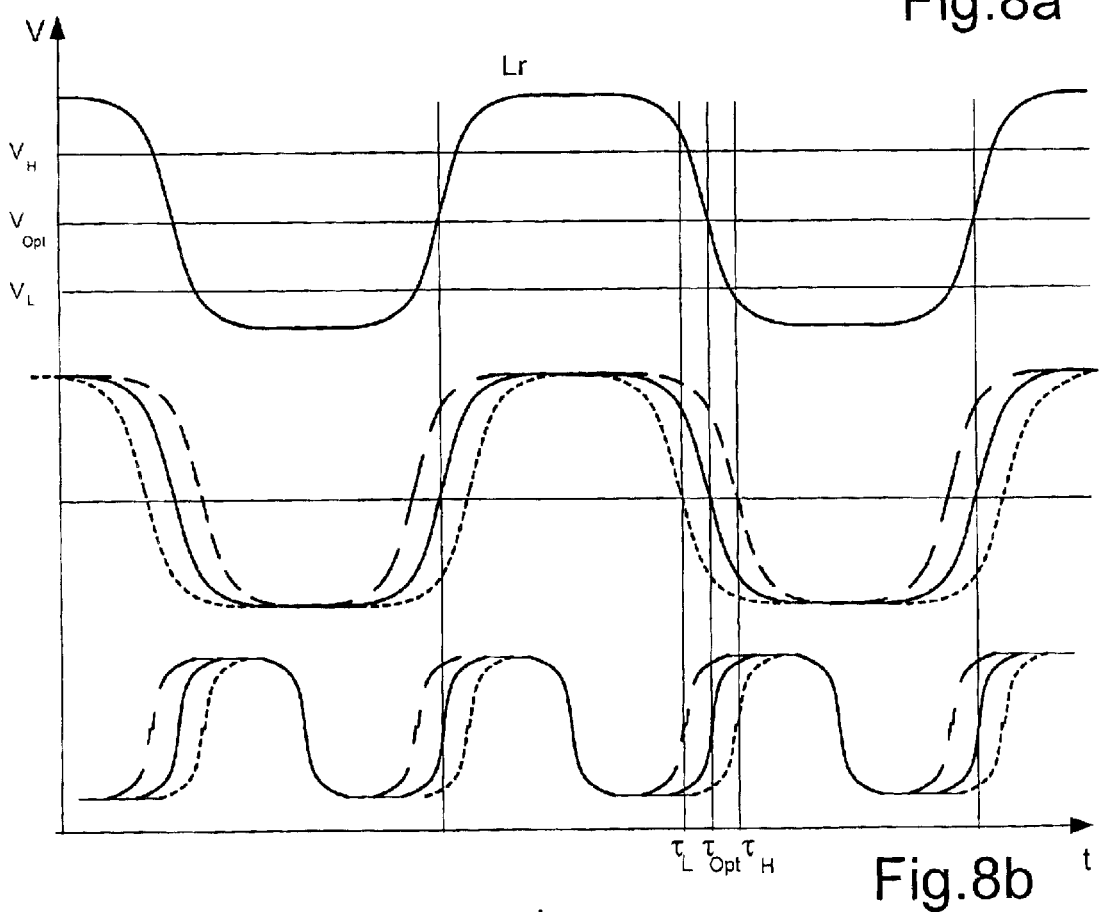
FIG. 8b shows wave forms for an initial clock signal (upper), a clock signal at the input of clock doubler corresponding to different values of control voltage at the input of duty cycle correction stage called threshold as shown in FIG. 8c (middle) and a resulting doubled clock at the output of clock doubler (bottom).

The third feedback circuit includes low pass filter 35 feeding integrator 36 and serves for controlling the transmitter's 30 power supply voltage (V) and balance the threshold transition points ( corresponding, e.g. to high and low power supply voltages as explained in FIG. 8b.

The auxiliary self-calibrated receiver 12 serves for controlling even rising edge timings and comprises two feedback circuits, the first being for self-calibration of register 12 and includes a low pass filter 14 feeding integrator 16 for generating a feedback signal using analogue delay element 8, and the second for generating a rising edge feedback signal to deskew the even rising edge of the output of register 30 with respect to transmitter reference signal using verniers or analogue delay elements 37.

The total skew in this situation amounts to a sum of intra-channel input skew of the auxiliary registers 12 and 52 and intra-channel output skew of register 30. By the means described herein the overall timing inaccuracy of an entire system can be reduced to few picoseconds after compensation for the differential track lengths between channels due to packaging.

Operation

The operation of the invention will now be illustrated with respect to the example embodiment shown in FIG. 2a.

On power up, assume the variable delay 8 is at minimum. This means the system will have a maximum negative skew. In this situation, the clock obeys all setup requirements for the reference line and register 12 will be stable, that is it will not be in its timing uncertainty region of operation. Assuming inverting feedback, the register will produce a steady binary 1 on its output, which after the low pass filter 14 and integrator 16 causes a rising voltage on the output of the integrator, i.e. on the input to the clock vernier 8. This will cause the clock vernier 8 to increase in its delay value until the clock reaches a zero skew with respect to the reference signal after taking into account all setup and hold requirements caused by a difference between the propagation delay in the clock and data paths within the register.

This will produce a stable level of the feedback signal, whether digital or analogue, matching the level which is the maximum level of timing uncertainty within the register, which corresponds to the predetermined level of probability, that is, with 50% of the output being a binary 1 and 50% being a binary 0. The above described operation may be also applicable to the example embodiment of FIG. 3 as it shall be evident for a specialist in the art. In the embodiment of FIG. 3 the modulator signal is generated by using another channel of the same register to produce a triangle signal formed by low pass filter 24, inverting integrator 26 and resistors 22 and 23.

In the case where the register has a degree of hysteresis, the modulator signal will push the reference signal in and out of the timing uncertainty region on each side (as illustrated in FIGS. 4a–4f). This will produce signal which will vary from continuous binary 0s on the corresponding output channel of the register, to continuous binary 1s, with the phase noise state framed equally by these two stable states, such that if the output of the register was sampled then the number of 1s and 0s appearing would be equal.

The operation of the third example embodiment shown in FIG. 6 will now be described. It shall be appreciated that the circuitry including elements 8, 12, 14, 16, operates in the same mode as described with reference to FIGS. 2–3, so that register 12 has a zero input skew in relation to transmitter reference signal.

In the third embodiment, after register has reached a stable position at a predetermined level of probability of reading a desired symbol in a sequence of symbols, e.g. at the maximum of its phase noise in the channel D0-DQ0, assume the variable delays 8, 37 are at minimum. This means the transmitter 30 has a maximum negative skew. In this situation, the signal from the output DQ0 of transmitter 30 obeys all setup requirements for the input D1 of auxiliary receiver 12 and channel D1-DQ1 is also in its stable state.

Assuming inverting feedback, the channel D1-DQ1 of register 12 will produce a steady binary 1 on its output DQ1, which after the low pass filter 32 and integrator 33 causes a rising voltage on the output of the integrator 33, i.e. on the input to the clock vernier 37. This will cause the clock vernier 37 to increase in its delay value until matching the level of probability which corresponds to the maximum level of phase noise within the channel D1-DQ1 of register 12, that is with 50% of the output DQ1 of register 12 being a binary 1 and 50% being a binary 0, i.e. the sense signal from channel DQ0 of the transmitter 30 reaches a zero skew with respect to the transmitter reference assuming the skew on the input D0 of register 12 in relation to transmitter reference is already zero.

Thus, the maximal skew between the output DQ0 of register 30 and transmitter reference will be determined by the input intra-channel skew of the auxiliary register 12. Thus, outputs DQ1–DQN of transmitter 30 will have a skew with respect to transmitter reference which is not more than the sum of intra-channel output skew of transmitter 30 and intra-channel input skew of register 12.

The operation of the forth example embodiment shown in FIG. 9 will now be described in detail. It shall be appreciated that the even rising edge deskewing circuitry incorporating elements 8, 12, 14, 16, 30, 32, 33, 37 operates in the same mode as described with reference to FIGS. 2a, 3 and 6.

According to the forth embodiment, to provide the symmetry of the rising and falling edges, the following procedure is performed.

First, the position of the falling edge is determined with respect to the reference clock. When the falling edge crosses the threshold line earlier than the reference clock, it means that the power supply voltage is low. In this case, an error signal produced by the phase comparator 52 passes through low pass filter 35 and causes integrator 36 to increase its output voltage which is supplied into the transmitter 30 so that the transmitter's power supply voltage also rises.

It shall be also appreciated that the above correction procedure may be implemented using parameters influencing the symmetry of the falling and rising edges, other than power supply voltage, for example, slew rate control, or others, as is evident for a specialist in the art.

Each step of the correction moves the transition point to the right until it coincides with the reference clock and the error signal at the output of the phase comparator 52 corresponds to the maximum of timing uncertainty as has been described in detail above.

To exclude the duty cycle irregularities, the procedure is performed as follows.

Figure 8C:
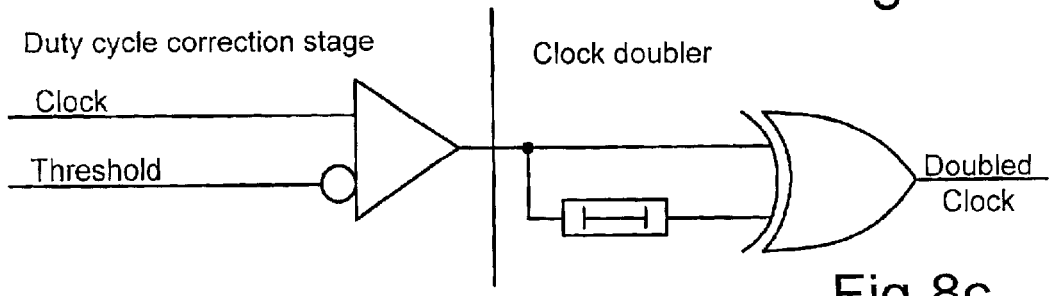
FIG. 8c is a block diagram of the duty cycle correction stage and clock doubler according to the present invention.

As far as a DDR system transmits two bits of information per each clock period, a driver (transmitter) is required which is capable of changing its state accurately on each edge of the main clock, i.e. a "DDR" type clock is needed. In FIG. 8c a block scheme is shown illustrating a clock doubler which forms two rising edges per each clock cycle out of the falling and rising edges of an input clock signal.

However, in this circumstances, an additional source of inaccuracy arises in connection with the possible inequity of times of high level and low level states of input clock signal and other inaccuracies caused by clock doubler or, for example, transmitter. For the purposes of the present explanation, even data transmission slot corresponds to rising edge of input clock, wherein odd data transmission slot corresponds to falling edge of input clock.

Assuming, at the beginning, that the time intervals between toggles at transmitter's outputs driving sense lines corresponding to the rising and falling edges of transmitter's reference are not equal, as shown in FIG. 9, wherein the odd rising edge appears before the transmitter's reference that corresponds to the high voltage level of threshold input on duty cycle correction stage incorporated in unit 41.

In this case, an error signal produced by the phase comparator 52 passes through low pass filter 53 and causes integrator 55 to decrease its output voltage. As a result, the duty cycle of the clock signal at the output of the duty cycle correction stage incorporated in unit 41 shown in FIG. 9 increases. Thus, the odd rising edge is being delayed until it matches the transmitter's reference.

Thus, odd rising edges are also placed exactly in the position of the transmitter's reference edges. Being reminded that even rising edges are simultaneously deskewed as has been described above, the skew caused by rising and falling edge asymmetry is practically eliminated.

Figure 10A:
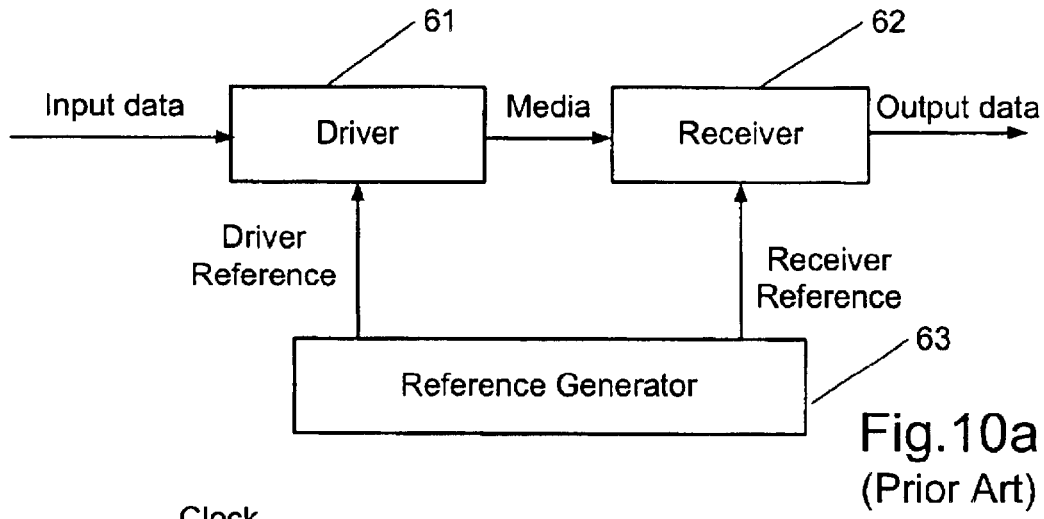
FIG. 10a is a block diagram of a self calibrated transmission system comprising a driver and a receiver according to the present invention.
Figure 10B:
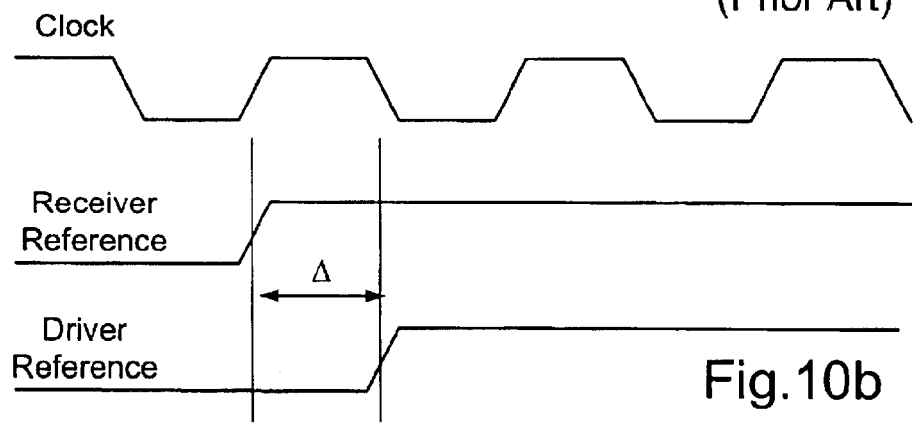

To provide the maximum channel bandwidth, or the highest possible data rate with a predefined bit error rate (BER), the following technique is proposed as illustrated in FIGS. 10a and 10b. Typically, BER is in a range from $10^{-3}$ to $10^{-15}$ depending on a particular application requirements.

The system illustrated in FIG. 10a comprises a driver 61, a receiver 62 and a generator 63 for generating reference signals for driver 61 and receiver 62. The reference signal generator generates signals as shown in FIG. 10b.

Figure 10C:
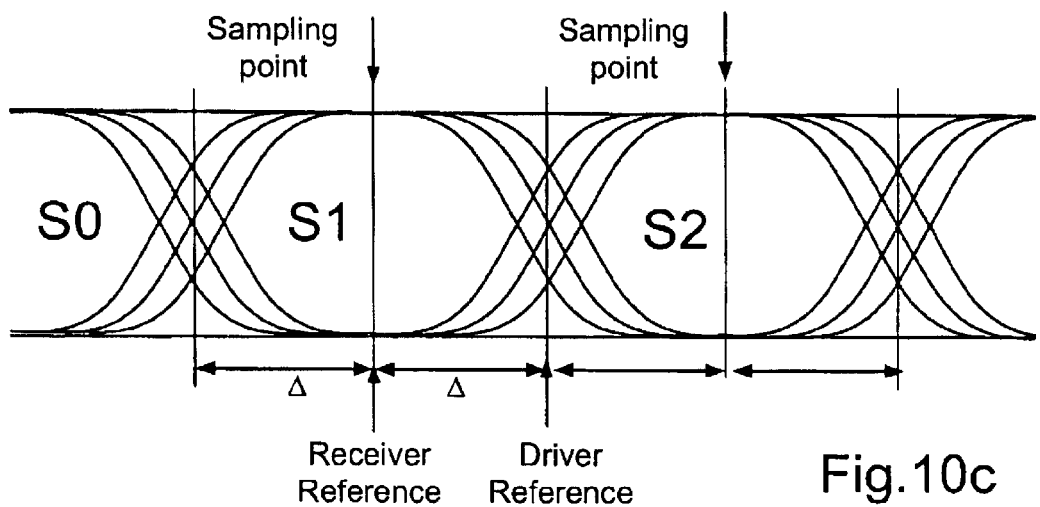
FIG. 10c is an eye diagram illustrating the preferred placement of signals with reference to each other according to the present invention.

Let us consider FIG. 10c illustrating a channel of data transferred through a media. As has already been discussed in detail above, the probability of reading a symbol an a sequence of symbols in a channel can be described by a probability curve from FIG. 7b. Using this curve, it is possible to define the amount of time for which a moment of reading data shall be ahead of the driver's reference where the probability corresponds to a predefined level, e.g. 50/50 to correspond to the required BER.

To achieve this, it is necessary to find a point on the curve having a height of the required BER. The time difference between the time "0" and the time determined by this point will be Δ. Now, it is obvious that the Receiver reference shall differ from the Driver reference by this amount of time Δ as shown in FIG. 10b. Therefore, after Δ is defined, it is possible to maintain the predefined BER level and maximum data rate, if symbols are transmitted through a channel with a rate of 2Δ per one symbol as illustrated in FIG. 10c.

It shall be mentioned that all the above described feedback loops shall present the negative feedback to provide a stable operation and may require using additional circuitry elements as is evident for a specialist in the art.

It shall be appreciated also that other embodiments and modifications of the present invention are possible within the scope of the present invention. Thus, the invention may be applied to compensating skews in communication systems that can serve to increase the bandwidth of signal transmission. Also, it can be used to reduce the distribution of the phase noise and its effect on changes in the clock to output delays or changes in the actual setup and hold time. It can be applied to reduce timing dispersion of a signal in cases when signals are transmitted via an optical cable or via the ether and in various other applications including application specific integrated circuits (ASIC) comprising digital interfaces requiring low skew.

What is claimed:

1. A timing control device for the compensation of timing errors in multiple channel devices comprising at least one register, the device comprising:

a clock for providing a clock signal to each said at least one register;

a reference signal generator for providing a reference signal applicable through a reference channel to said register, for deskewing the register's channels with respect to said reference signal;

wherein for each said register a corresponding feedback loop is associated for the relative alignment of register's channels timing in relation to the reference signal, said feedback loop comprising a means for detecting a deviation from a predetermined level of probability of reading by said register a desired symbol on a boundary of two reference channel symbols in a sequence of symbols transmitted through the reference channel; and a set of delay means which uses the determined information on deviation from the predetermined level of said probability to generate a feedback signal to compensate timing errors in said register.

2. A timing control device according to claim 1 further comprising a sample hold device for holding a value of a first symbol in a sequence of repetitive signals transmitted through the reference channel.

3. A timing control device for the compensation of timing errors in multiple channel devices comprising at least one register, the device comprising:

a clock for providing a clock signal to said at least one register;

a reference signal generator for providing a reference signal applicable through a reference channel to said at least one register, for deskewing the register's channels with respect to said reference signal;

wherein for each said at least one register a corresponding feedback loop is associated for the relative alignment of register's channels timing in relation to the reference signal, said feedback loop comprising a means for detecting a deviation from a predetermined level of probability of reading by said register a desired symbol on a boundary of two reference channel symbols in a sequence of symbols transmitted through the reference channel;

a set of delay means which uses the determined information on deviation from the predetermined level of said probability to generate a feedback signal to compensate timing errors in said register; and a modulator signal applied to the reference signal for obviating the timing hysteresis within the register.

4. A timing control device according to claim 1, wherein the reference signal changes state once per a predefined number of clock cycles.

5. A timing control device according to claim 1, wherein the reference signal is the clock signal with a constant delay.

6. A timing control device according to claim 3, wherein the modulator signal is generated by the oscillation of a channel of the register or another register.

7. A timing control device according to claim 1, wherein the set of delay means comprises a variable delay which is an analogue delay element having a monotonic transfer function.

8. A timing control device according to claim 1, wherein the set of delay means comprises a variable delay which is a digital delay element having a monotonic transfer function.

9. A timing control device according to claim 1, wherein the detecting means comprises an integrator and/or an amplifier and/or a filter.

10. A timing control device according to claim 9, wherein the filter comprises a low pass filter to reduce the bandwidth of the feedback signal to within the range of the integrator.

11. A timing control device according to claim 1, wherein the feedback loop comprises digital components for the integrator.

12. A timing control device according to claim 1, wherein the feedback loop comprises analogue components to generate a continuously variable feedback signal.

13. A timing control device according to claim 1, further comprising a duty cycle correction means.

14. A timing control device according to claim 1, further comprising a means for correcting skew caused by differences in time of crossing the threshold.

15. A self calibrating receiver comprising:

a register having a plurality of channels having inputs and outputs;

a clock means for providing a clock signal to the register;

a reference signal generator connectable to the input of at least one said channel of said register for supplying reference signals for deskewing the register;

a detecting means connectable to the output of at least one said channel of said register for detecting a deviation from a predetermined level of probability of reading by said register from said reference channel a desired symbol on a boundary of two reference channel symbols in a sequence;

wherein the output of the detecting means is connectable to a set of delay means which uses the information received by said detecting means to generate a feedback signal to compensate timing errors in said register.

16. The self calibrating receiver according to claim 15, further comprising a sample hold device for holding a value of a first symbol in a sequence of repetitive signals transmitted through the reference channel.

17. The self calibrating receiver according to claim 15, wherein the reference signal changes state once per a predefined number of clock cycles.

18. The self calibrating receiver according to claim 15, wherein the reference signal is the clock to the register signal.

19. The self calibrating receiver according to claim 15, wherein the reference signal is delayed by a fixed delay preferably to centre the reference transition in the middle of the programmable range of the variable delay on the clock path.

20. The self calibrating receiver according to claim 15, wherein the detecting means comprises an integrator and/or an amplifier and/or a filter.

21. The self calibrating receiver according to claim 20, wherein the filter is a low pass filter for reducing the bandwidth of the feedback signal to within the range of the integrator.

22. A self calibrating receiver comprising:

a register having a plurality of channels having inputs and outputs;

a clock means for providing a clock signal to the register;

a reference signal generator connectable to the input of at least one said channel of said register for supplying reference signals for deskewing the register;

a detecting means connectable to the output of at least one said channel of said register for detecting a deviation from a predetermined level of probability of reading by said register from said reference channel a desired symbol on a boundary of two reference channel symbols in a sequence;

wherein the output of the detecting means is connectable to a set of delay means which uses the information received by said detecting means to generate a feedback signal to compensate timing errors in said register; and p1 a modulator signal is applied to the reference signal for obviating the timing hysteresis within said register.

23. The self calibrating receiver according to claim 22, wherein the modulator signal is generated by the oscillation of a channel of the register or another register.

24. The self calibrating receiver according to claim 15, when used as a phase comparator.

25. The self calibrating receiver according to claim 15, when used as a plurality of phase comparators using the same reference clock.

26. A self calibrating transmitter with expandable data width comprising:
   at least one register having at least one channel having an input and output.
   a clock means for providing a clock signal to said register;
   a reference signal generator for supplying reference signals for deskewing said register's channel output in relation to the reference signal;
   a phase comparator one input of which is connected to the reference signal and another input is connected to a sense signal at the register's output; and
   at least one feedback loop associated with the output of said phase comparator, the feedback loop comprising a set of delay means to compensate the timing errors in transmitter channels wherein
   the reference signal is connectable to the input of the phase comparator and
   an input of at least one said channel of said register is connectable to another signal for providing the sense signal to the phase comparator for deskewing the register.

27. The transmitter according to claim 26, wherein the register comprises a plurality of channels for data transmitting and/or providing sense signal to phase comparator for deskewing the register.

28. The self calibrating transmitter according to claim 26, wherein the phase comparator is a self calibrated receiver as claimed in claim 15.

29. The self calibrating transmitter according to claim 26, wherein the phase comparator is a flip-flop.

30. The self calibrating transmitter according to claim 26, further comprising a sample hold device for holding a value of a first symbol in a sequence of repetitive signals transmitted through the reference channel.

31. The self calibrating transmitter according to claim 26, wherein the reference signal changes state once per a predefined number of clock cycles.

32. The self calibrating transmitter according to claim 26, wherein the necessity for a plurality of channels is obviated by using a data channel where the data has known characteristics and control over the feedback system to ensure the data has transitions.

33. The self calibrating transmitter according to claim 32, wherein the input of at least one other channel of the self calibrating receiver is connected to other drivers for calibrating them in relation to the reference clock.

34. The self calibrating transmitter according to claims 26, further comprising a modulator signal applied to the reference signal for obviating the timing hysteresis within said register.

35. The self calibrating transmitter according to claim 26, wherein said transmitter reference signal is selected from non-inverted, inverted, and differential.

36. The transmitter according to claim 26, wherein said another signal for providing the sense signal to the phase comparator for deskewing the register is selected from single-ended reference, both single-ended and inverted reference, and differential reference signal.

37. The transmitter according to claim 26, wherein said phase comparator comprises at least one channel for providing rising edge sense signal and at least one channel for providing falling edge sense signal to phase comparators for deskewing the register.

38. The transmitter according to claim 37, wherein both the rising edge sense signal and the falling edge sense signal at the register s output are connected to said phase comparators.

39. The transmitter according to claim 38, wherein the rising edge sense signal is further connected to a second phase comparator for duty cycle correction.

40. An integrated circuit incorporating at least one register and a timing control device for the compensation of timing errors to create the characteristics of a zero setup and hold time integrated circuit, wherein
   the timing control device comprises:
   a clock for providing a clock signal;
   a reference signal generator for providing a reference signal applicable through a reference channel to said register, for deskewing the registers channels with respect to said reference signal;
   wherein for each said register a corresponding feedback loop is associated for the relative alignment of register's channels timing in relation to the reference signal said feedback loop comprising
   a means for detecting a deviation from a predetermined level of probability of reading by said register a desired symbol on a boundary of two reference channel symbols in a sequence of symbols transmitted through the reference channel; and
   a set of delay means which uses the determined information on deviation from the predetermined level of said probability to generate a feedback signal to compensate timing errors in said register.

41. An interface for high speed data transmission incorporating the timing control device according to claim 1.

42. A test system incorporating at least one register and a timing control device for the compensation of timing errors, wherein the timing control device comprises:
   a clock for providing a clock signal;
   a reference signal generator for providing a reference signal applicable through a reference channel to said register for deskewing the register's channels with respect to said reference signal;
   wherein for each said register a corresponding feedback loop is associated for the relative alignment of register's channels timing in relation to the reference signal, said feedback loop comprising
   a means for detecting a deviation from a predetermined level of probability of reading by said register a desired symbol on a boundary of two reference channel symbols in a sequence of symbols transmitted through the reference channel; and
   a set of delay means which uses the determined information on deviation from the predetermined level of said probability to generate a feedback signal to compensate timing errors in said register.

43. A method for the compensation of liming errors in multiple channel devices comprising at least one register, the method comprising the steps of:
   providing a common clock signal to each said at least one register;
   providing reference signals for deskewing the register;
   detecting a deviation from a predetermined level of probability of reading by said register a desired symbol on a boundary of two reference channel symbols in a sequence; and generating for each said register a feedback signal using the determined information on deviation to compensate timing error in said register until the clock reaches a zero skew with respect to the reference signal.

44. A method according to claim 43, wherein the deviation is further treated using an integrator.

45. A method according to claim 43, wherein the deviation is further treated using an amplifier.

46. A method according to claim 43, further comprising a step of filtering, such as in a low pass filter, to reduce the bandwidth of the feedback signal to within the range of the integrator.

47. A method for the compensation of timing errors in multiple channel devices comprising at least one register, the method comprising the steps of:

providing a clock signal to said register;

providing reference signals for deskewing the register;

detecting a deviation from a predetermined level of probability of reading by said register a desired symbol on a boundary of two reference channel symbols in a sequence;

generating for each said register a feedback signal using the determined information on deviation to compensate timing errors in said register until the clock reaches a zero skew with respect to the reference signal; and supplying a modulator signal applied to the reference signal for obviating the timing hysteresis within the register.

48. A method according to claim 47, wherein the modulator signal is generated by the oscillation of a channel of the register or another register.

49. A method according to claim 43, wherein the feedback signal is generated using the information determined either for rising, or falling edge.

50. A method according to claim 49, wherein both the rising and falling edges are levelled with respect to the reference clock.

51. A method according to claim 49, wherein even rising, even falling and odd rising edges are levelled with respect to the reference clock.

* * * * *

UNITED STATES PATENT AND TRADEMARK OFFICE
CERTIFICATE OF CORRECTION

PATENT NO. : 6,834,255 B2
DATED : December 21, 2004
INVENTOR(S) : Igor A. Abrosimov et al.

It is certified that error appears in the above-identified patent and that said Letters Patent is hereby corrected as shown below:

Title page,
Item [73], Assignee, please delete "Acuid Corporation (Guernsey) Limited, Guernsey (VG)" and substitute -- Acuid Corporation (Guernsey) Limited, Guernsey (GB) --.

Signed and Sealed this

Twenty-fourth Day of May, 2005

JON W. DUDAS
*Director of the United States Patent and Trademark Office*